(12) United States Patent
Hirase et al.

(10) Patent No.: US 10,319,941 B2
(45) Date of Patent: Jun. 11, 2019

(54) ELECTROLUMINESCENCE DEVICE

(71) Applicant: Sharp Kabushiki Kaisha, Sakai, Osaka (JP)

(72) Inventors: Takeshi Hirase, Sakai (JP); Tetsuya Okamoto, Sakai (JP); Tohru Senoo, Sakai (JP); Tohru Sonoda, Sakai (JP); Mamoru Ishida, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 2 days.

(21) Appl. No.: 15/551,530

(22) PCT Filed: Feb. 9, 2016

(86) PCT No.: PCT/JP2016/053734
§ 371 (c)(1),
(2) Date: Oct. 23, 2017

(87) PCT Pub. No.: WO2016/132954
PCT Pub. Date: Aug. 25, 2016

(65) Prior Publication Data
US 2018/0040848 A1 Feb. 8, 2018

(30) Foreign Application Priority Data

Feb. 16, 2015 (JP) .................................. 2015-027992

(51) Int. Cl.
*H01L 51/52* (2006.01)
*H01L 27/32* (2006.01)
(Continued)

(52) U.S. Cl.
CPC ...... *H01L 51/5246* (2013.01); *H01L 27/3262* (2013.01); *H01L 51/0097* (2013.01);
(Continued)

(58) Field of Classification Search
CPC .. H01L 51/524; H01L 51/5246; H01L 51/525
(Continued)

(56) References Cited

U.S. PATENT DOCUMENTS

2007/0170455 A1 7/2007 Choi et al.
2009/0142984 A1 6/2009 Logunov et al.
(Continued)

FOREIGN PATENT DOCUMENTS

JP 2007-200890 A 8/2007
JP 2008-153004 A 7/2008
(Continued)

*Primary Examiner* — David Vu
*Assistant Examiner* — Brandon C Fox
(74) *Attorney, Agent, or Firm* — ScienBiziP, P.C.

(57) ABSTRACT

An organic EL display device (electroluminescence device) including a TFT substrate (substrate), an organic EL element (electroluminescence element) disposed on the TFT substrate, a first inorganic film covering the organic EL element, at least one protruding body having a frame shape, the at least one protruding body being configured by an organic film and surrounding the electroluminescence element on the first inorganic film, a second inorganic film covering the first inorganic film and the at least one protruding body, and a leveled film configured by an organic film and provided on the second inorganic film.

20 Claims, 11 Drawing Sheets

(51) Int. Cl.
*H01L 51/00* (2006.01)
*H05B 33/04* (2006.01)
*H05B 33/14* (2006.01)
*H01L 51/50* (2006.01)

(52) U.S. Cl.
CPC ...... *H01L 51/5012* (2013.01); *H01L 51/5253* (2013.01); *H05B 33/04* (2013.01); *H05B 33/14* (2013.01); *H01L 27/3276* (2013.01); *H01L 51/5209* (2013.01)

(58) Field of Classification Search
USPC .......................................... 313/504; 257/40
See application file for complete search history.

(56) References Cited

U.S. PATENT DOCUMENTS

| | | | |
|---|---|---|---|
| 2010/0258346 A1* | 10/2010 | Chen | H01L 21/56 174/521 |
| 2011/0037383 A1 | 2/2011 | Colburn | |
| 2011/0234477 A1 | 9/2011 | Sano et al. | |
| 2011/0248625 A1* | 10/2011 | Kwon | H01L 51/524 313/504 |
| 2013/0334959 A1* | 12/2013 | Wang | H01L 51/5256 313/512 |
| 2016/0064690 A1* | 3/2016 | Kook | H01L 51/5256 257/40 |
| 2017/0084866 A1* | 3/2017 | Sonoda | H01L 51/50 |
| 2017/0133619 A1* | 5/2017 | Hasegawa | H01L 27/3246 |
| 2018/0097200 A1* | 4/2018 | Park | H01L 51/5253 |
| 2018/0159070 A1* | 6/2018 | He | H01L 27/3244 |

FOREIGN PATENT DOCUMENTS

| | | |
|---|---|---|
| JP | 2011-505667 A | 2/2011 |
| JP | 2011-198675 A | 10/2011 |
| JP | 2013-016371 A | 1/2013 |
| JP | 2016-054144 A | 4/2016 |

\* cited by examiner

ELECTROLUMINESCENCE DEVICE

TECHNICAL FIELD

The present disclosure relates to an electroluminescence device including an electroluminescence (EL) element.

BACKGROUND ART

In recent years, flat panel displays have been utilized in various products and fields, and there are demands for flat panel displays having even larger sizes, even higher picture quality, and even lower power consumption.

In view of such circumstances, organic electroluminescence (referred to as EL below) display devices provided with organic EL elements utilizing the electro luminescence of organic materials are attracting much attention as flat panel displays due to their excellent qualities, such as low voltage driving, high responsiveness, and self-luminosity, while being in a completely solid state.

For example, in the case of an active-matrix organic EL display device, a thin-filmed organic EL element is disposed on a substrate on which thin film transistors (TFT) are provided. The organic EL element includes an organic EL layer including a light-emitting layer layered between a pair of electrodes. The TFT is connected with either side of the pair of electrodes. Then, voltage is applied across the pair of electrodes to make the light-emitting layer emit light, whereby image display is performed.

Furthermore, for the conventional organic EL display device stated above, it is proposed to seal the organic EL elements to prevent the organic EL elements from deteriorating due to moisture or oxygen.

More specifically, the conventional organic EL display device stated above includes an organic EL element, a substrate including the organic EL element mounted thereon, and a sealing substrate provided facing the substrate, as stated, for example, in PTL 1 stated below. Furthermore, the conventional organic EL display device has a frame-shaped glass frit provided between the substrate and the sealing substrate and surrounding the organic EL element, whereby the organic EL element can be sealed.

CITATION LIST

Patent Literature

PTL 1: Japanese Unexamined Patent Application Publication No. 2007-200890A

SUMMARY

Technical Problem

However, in the case of the conventional organic EL display device (electroluminescence device) stated above, the glass frit is installed using a laser in order to enhance a barrier property of the organic EL element. Thus, with the conventional organic EL display device, manufacturing processes become complicated, and manufacturing yields reduce, which lead to a problem of increased cost.

In view of the problems stated above, an object of the present disclosure is to provide an electroluminescence device that exhibits excellent barrier property and can be produced in a simple manner at a reduced cost.

Solution to Problem

To achieve the object stated above, an electroluminescence device according to an aspect of the present invention provides an electroluminescence device including a substrate, an electroluminescence element provided on the substrate, a first inorganic film covering the electroluminescence element, at least one protruding body having a frame shape, the at least one protruding body including an organic film and surrounding the electroluminescence element on the first inorganic film, a second inorganic film covering the first inorganic film and the at least one protruding body, and a leveled film configured by an organic film and provided on the second inorganic film.

In the case of the electroluminescence device having the configuration stated above, the first inorganic film covers the electroluminescence element. Furthermore, the protruding body is provided surrounding the electroluminescence element on the first inorganic film. In addition, the second inorganic film covers the first inorganic film and the protruding body. Moreover, the leveled film is provided on the second inorganic film. Thus, unlike the conventional example stated above, this allows the electroluminescence device to be configured that exhibits excellent barrier property and can be produced in a simple manner at a reduced cost.

Furthermore, in the electroluminescence device stated above, an organic film layer configured by an organic film may be disposed between the first inorganic film and the second inorganic film.

In this case, the organic film layer covers the first inorganic film. Thus, even in the case where a void occurs in the first inorganic film, the void can be filled with the organic film layer, and as a result, this configuration can secure the barrier property.

Furthermore, in the electroluminescence device stated above, the organic film layer preferably has a thickness greater than a thickness of the first inorganic film.

In this case, this configuration can reliably obtain the barrier property.

Furthermore, in the electroluminescence device stated above, the at least one protruding body preferably each has a protruding height greater than a total value of the thickness of the first inorganic film and a thickness of the organic film layer.

In this case, this configuration can easily prevent moisture from permeating the electroluminescence element from the outside.

Furthermore, in the electroluminescence device stated above, the at least one protruding body preferably each has a density greater than a density of the organic film layer.

In this case, an organic film having more excellent barrier property than that for the organic film layer is used for the protruding body, and hence, the electroluminescence device having excellent barrier property can be easily configured.

Furthermore, in the electroluminescence device stated above, an organic film used for the organic film layer may be identical to an organic film used for the leveled film.

In this case, the electroluminescence device that can be produced in a simple manner can be easily configured.

Furthermore, in the electroluminescence device stated above, the at least one protruding body preferably includes a plurality of protruding bodies, and the plurality of protruding bodies preferably are disposed on the first inorganic film and sequentially surround the electroluminescence element.

In this case, this configuration can easily improve an effect of preventing deterioration of the electroluminescence element as compared with a case where one protruding body is provided.

Furthermore, in the electroluminescence device stated above, the electroluminescence element and the plurality of protruding bodies may each include at least one corner including an arc portion formed into an arc shape.

In this case, the electroluminescence device can be easily configured that includes the electroluminescence element having at least one corner having the arc portion provided thereon and has excellent barrier property.

Furthermore, in the electroluminescence device stated above, the electroluminescence element and the at least one protruding body may be formed into a round shape.

In this case, the electroluminescence device can be configured that includes the round-shaped electroluminescence element and has excellent barrier property.

Furthermore, in the electroluminescence device stated above, the electroluminescence element and the at least one protruding body may be formed into an oval shape.

In this case, the electroluminescence device can be easily configured that includes the oval-shaped electroluminescence element and has excellent barrier property.

Furthermore, in the electroluminescence device stated above, the at least one protruding body preferably each has a protruding height greater than a thickness of the first inorganic film.

In this case, this configuration can easily prevent moisture from permeating the electroluminescence element from the outside.

Furthermore, in the electroluminescence device stated above, the at least one protruding body preferably each has a protruding height than a thickness of the electroluminescence element.

In this case, this configuration can easily prevent moisture from permeating the electroluminescence element from the outside.

Furthermore, in the electroluminescence device stated above, the at least one protruding body preferably each has a density greater than a density of the leveled film.

In this case, an organic film having more excellent barrier property than that for the leveled film is used for the protruding body, and hence, and the electroluminescence device having excellent barrier property can be easily configured.

Furthermore, in the electroluminescence device stated above, a material having flexibility is used in the substrate.

In this case, the bendable electroluminescence device can be easily configured.

Advantageous Effects of Invention

According to an aspect of the present invention, an electroluminescence device can be provided that exhibits excellent barrier property and can be produced in a simple manner at a reduced cost.

BRIEF DESCRIPTION OF DRAWINGS

FIG. 8 is a diagram illustrating a series of main manufacturing processes subsequently performed after the manufacturing processes illustrated in FIG. 7B.

DESCRIPTION OF EMBODIMENTS

Hereinafter, a preferred embodiment of an electroluminescence device according to the present invention will be stated with reference to the drawings. Note that the following description will be made by giving an example in which the present invention is applied to an organic EL display device. In addition, in each of the drawings, the dimensions of constituent elements are not precisely illustrated as the actual dimensions of the constituent elements and the dimensional proportions of each of the constituent elements.

First Embodiment

Figure 1:
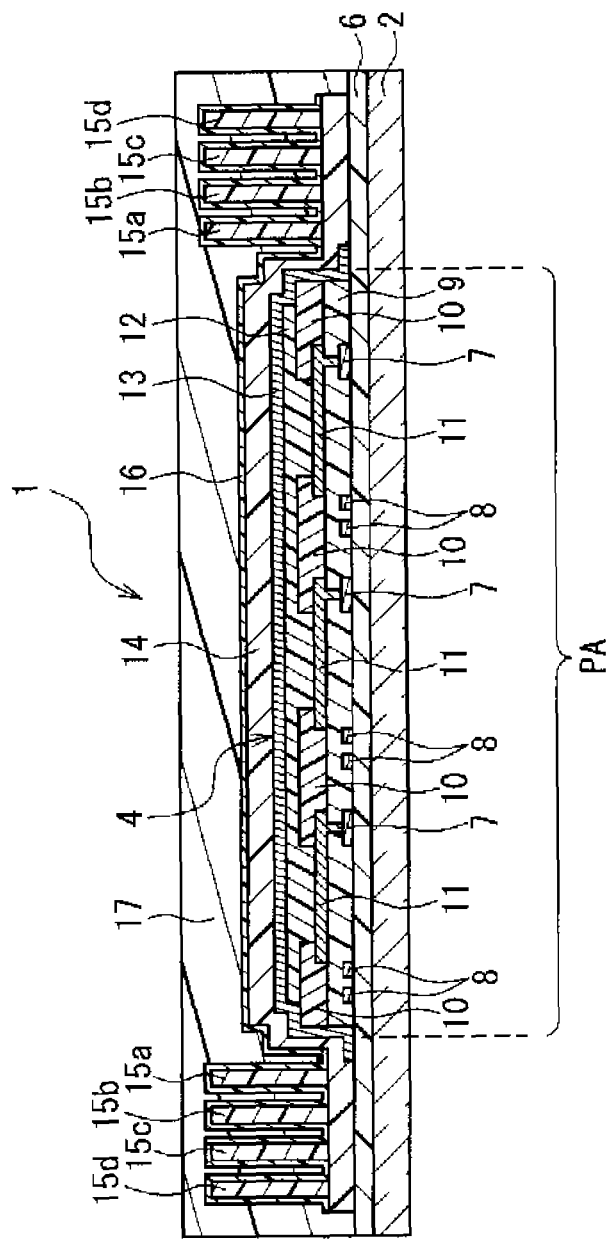
FIG. 1 is a cross sectional view illustrating a cross section of an organic EL display device according to a first embodiment of the present invention.
Figure 2:
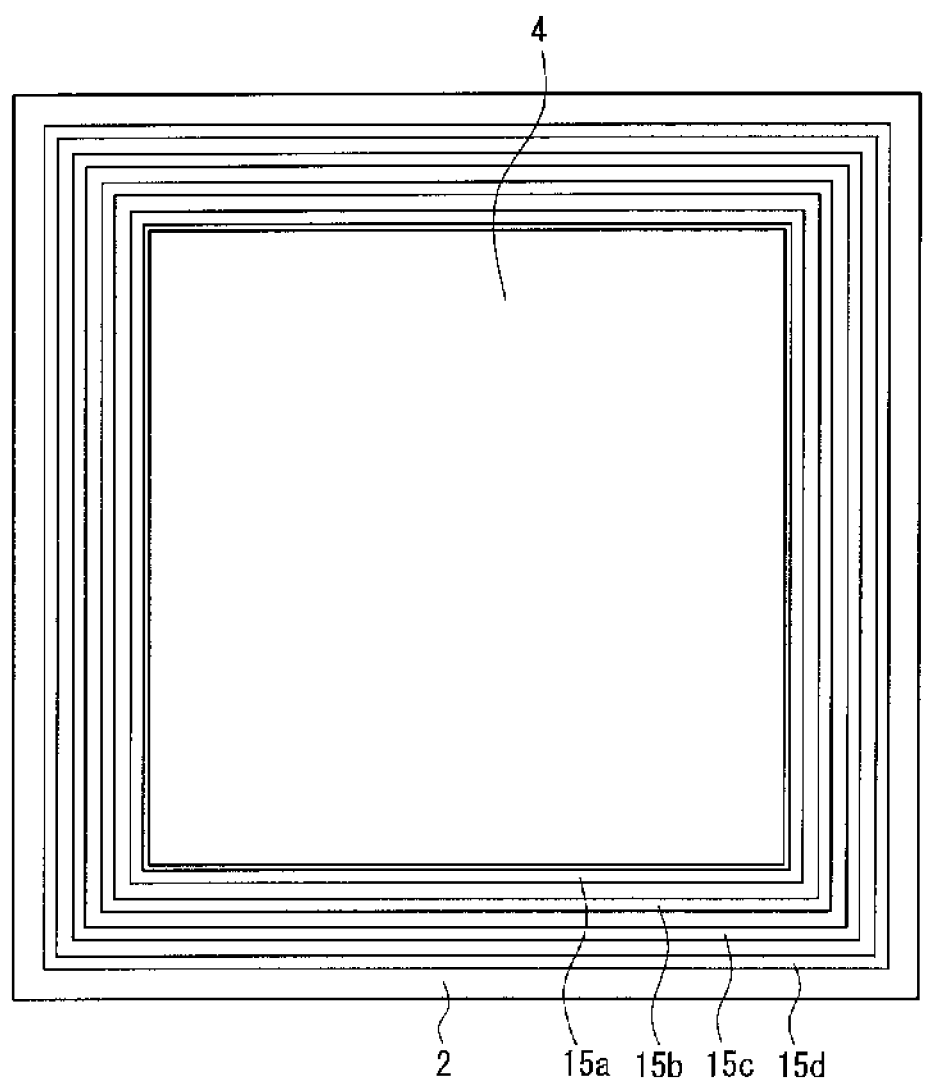
FIG. 2 is a plan view for explaining a configuration of a protruding body illustrated in FIG. 1.

FIG. 1 is a cross sectional view illustrating a cross section of an organic EL display device according to a first embodiment of the present invention. FIG. 2 is a plan view for explaining a configuration of a protruding body illustrated in FIG. 1. In FIG. 1, an organic EL display device 1 according to the present embodiment includes a TFT substrate 2 serving as a substrate and an organic EL element 4 serving as an electroluminescence element disposed on the TFT substrate 2.

Furthermore, in the organic EL display device 1 according to the present embodiment, the organic EL element 4 constitutes a rectangular-shaped pixel area PA including the plurality of pixels (including the plurality of sub pixels), and this organic EL element 4 is sealed with a first inorganic film, a second inorganic film, protruding bodies, and a leveled film, each of which will be stated later. In addition, the pixel area PA forms a display unit of the organic EL display device 1 to display information. More specifically, this pixel area PA is configured in a manner such that the plurality of pixels (the plurality of sub pixels) are arranged in a matrix manner, and the organic EL element 4 emits light at each of the sub pixels, whereby information is displayed.

Furthermore, in FIG. 1, the TFT substrate 2 is made of, for example, a glass material, or a film having flexibility (bendable property), or the like. In addition, the TFT substrate 2 has a foundation film (insulating film) 6 provided covering the entire TFT substrate 2. In addition, as illustrated in FIG. 1 as an example, in a light-emitting region of the organic EL display device 1, each of the sub pixels in the pixel area PA is provided with a thin film transistor (TFT) 7 on the foundation film 6. Moreover, wires 8 including a plurality of source lines (signal lines) and a plurality of gate lines, each of which is formed in a matrix manner, are formed on the foundation film 6. Each of the source line and each of the gate line are connected with a source driver and a gate driver, respectively, (not illustrated) configured to drive the TFT 7 for each of the sub pixels according to image signals inputted from the outside. In addition, the TFT 7 functions as a switching element that controls light emission of the corresponding sub pixel, and controls the light emission in the sub pixel of each of red (R), green (G), and blue (B) made of the organic EL element 4.

Note that the foundation film 6 is provided to prevent characteristics of the TFT 7 from deteriorating due to diffusion of impurities from the TFT substrate 2 to TFT 7, and may be omitted if there is no concern about such deterioration.

In addition, in the case where a flexible material is used for the TFT substrate 2, a bendable organic EL display device 1 can be easily configured.

In addition, as illustrated in FIG. 1, an interlayer insulating film 9, an edge cover 10, and a first electrode 11 of the organic EL element 4 are formed on the TFT substrate 2. The interlayer insulating film 9 functions as a leveled film, and is disposed on the foundation film 6 covering the TFT 7 and the wires 8. The edge cover 10 is formed on the interlayer insulating film 9 covering a pattern edge of the first electrode 11. In addition, the edge cover 10 also functions as an insulating layer for preventing electrical short circuit between the first electrode 11 and a second electrode 13, which will be stated later. In addition, the first electrode 11 is connected with the TFT 7 via a contact hole formed in the interlayer insulating film 9.

In addition, an opening of the edge cover 10, in other words, a portion at which the first electrode 11 is exposed substantially forms a light-emitting region of the organic EL element 4, and as stated above, the organic EL display device 1 according to the present embodiment is configured in a manner such that colored light with any of RGB is emitted so as to be able to perform full color display. In addition, the organic EL display device 1 according to the present embodiment is configured as an active-matrix display device including the thin film transistor (TFT) 7.

Furthermore, as illustrated in FIG. 1, an organic EL layer 12 and the second electrode 13 are formed on the first electrode 11, and the first electrode 11, the organic EL layer 12, and the second electrode 13 form the organic EL element 4. In other words, the organic EL element 4 is, for example, a light-emitting element capable of emitting light at high luminance as a result of low-voltage DC power driving, and includes the first electrode 11, the organic EL layer 12, and the second electrode 13.

More specifically, in the case where the first electrode 11 is a positive electrode, a hole injecting layer, a hole transport layer, a light-emitting layer, an electron transport layer, an electron injecting layer, and the like are layered as the organic EL layer 12 from the side of the first electrode 11 (not illustrated), and the second electrode 13 is formed as a negative electrode. Alternatively, instead of the configuration stated above, it may be possible to employ a configuration in which a single layer having two or more functions such as a layer having both functions of the hole injecting layer and the hole transport layer is formed. In addition, a carrier blocking layer or the like may be disposed in the organic EL layer 12 depending on application.

On the other hand, in the case where the second electrode 13 is a positive electrode, the order of layers in the organic EL layer 12 is reversed to that stated above.

In addition, in the case where the first electrode 11 is configured as a transparent electrode or a translucent electrode and the second electrode 13 is configured as a reflective electrode, the organic EL display device 1 is a bottom-emitting type in which light is emitted from the side of the TFT substrate 2. In other words, in the case of the bottom-emitting organic EL display device 1, the surface of the first electrode 11 on the side of the TFT substrate 2 substantially serves as the light-emitting surface of the organic EL element 4 to emit light to the outside.

On the other hand, in the case where the first electrode 11 is configured as a reflective electrode and the second electrode 13 is configured as a transparent electrode or a translucent electrode, the organic EL display device 1 is a top-emitting type in which light is emitted from the sealing film 14. In other words, in the case of the top-emitting organic EL display device 1, the surface of the first electrode 11 on the side of the sealing film 14 substantially serves as the light-emitting surface of the organic EL element 4 to emit light to the outside.

Furthermore, in the case of the organic EL display device 1 according to the present embodiment, the organic EL element 4 is scaled with the first inorganic film 14, a plurality of protruding bodies 15a, 15b, 15c, 15d, the second inorganic film 16, and the leveled film 17 as stated above. This sealing structure prevents moisture and oxygen from penetrating (permeating) from the outside, and thus prevents the organic EL element 4 from deteriorating.

More specifically, in the case of the organic EL display device 1 according to the present embodiment, the first inorganic film 14 is provided covering the organic EL element 4. An inorganic film made, for example, of SiN, SiON, or $Al_2O_3$ is used in the first inorganic film 14 and the film thickness (thickness), for example, is 50 nm or greater.

Furthermore, as also illustrated in FIG. 2, in the case of the organic EL display device 1 according to the present embodiment, the plurality of, for example, four protruding bodies 15a, 15b, 15c, and 15d are provided on the first inorganic film 14 surrounding the organic EL element 4. In addition, an organic layer made, for example, of polyimide, acrylic resin, epoxy resin or the like are used in these protruding bodies 15a, 15b, 15c, and 15e. In addition, these protruding bodies 15a, 15b, 15c, and 15d each have a protruding height of, for example, 100 nm or greater from the first inorganic film 14, and this protruding height is greater than the thickness of the organic EL element 4 and the thickness of the first inorganic film 14. In addition, these protruding bodies 15a, 15b, 15c, and 15d are provided, for example, at equal intervals surrounding the organic EL element 4.

Furthermore, in the case of the organic EL display device 1 according to the present embodiment, the second inorganic film 16 is provided covering the first inorganic film 14 and the protruding bodies 15a, 15b, 15c, and 15d. An inorganic film made, for example, of SiN, SiON, or $Al_2O_3$ is used in the second inorganic film 16 and the film thickness (thickness) is, for example, of 50 nm or greater.

Furthermore, in the case of the organic EL display device 1 according to the present embodiment, the leveled film 17 is provided on the second inorganic film 16. An organic film made, for example, of acrylate, polyurea, parylene, polyimide, or polyamide is used in the leveled film 17, and the film thickness (thickness) is, for example, of 100 nm or greater. In addition, this leveled film 17 has a density less than a density of the protruding bodies 15a to 15d. More specifically, an organic film having a density greater than that of the leveled film 17 is used in the protruding bodies 15a to 15d to achieve an improvement in the barrier property for the organic EL element 4. In addition, because the leveled film 17 is disposed on the pixel area PA, a colorless, transparent organic film is used in the leveled film 17. On the other hand, a colored organic film in addition to the colorless, transparent organic film may be used in the protruding bodies 15a to 15b.

Next, with reference to FIGS. 3 and 4, a method for manufacturing the organic EL display device 1 according to the present embodiment will be specifically described.

Figure 3A:
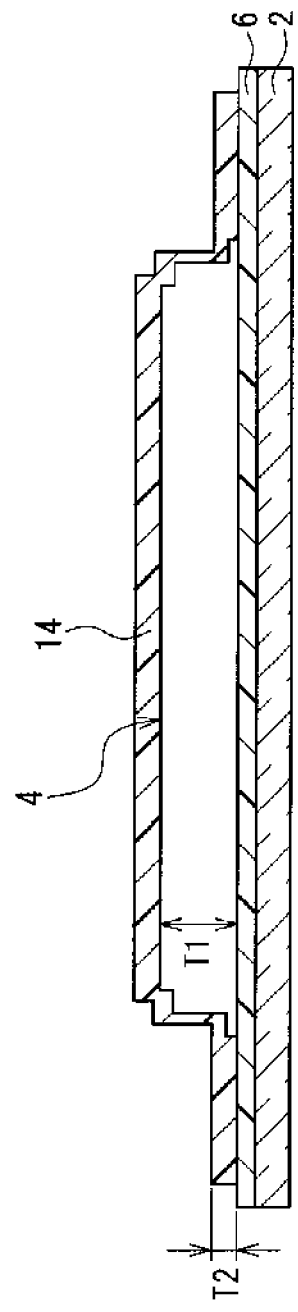
FIGS. 3A and 3B are diagrams for explaining main manufacturing processes for the organic EL display device, and are diagrams illustrating a series of main manufacturing processes.
Figure 3B:
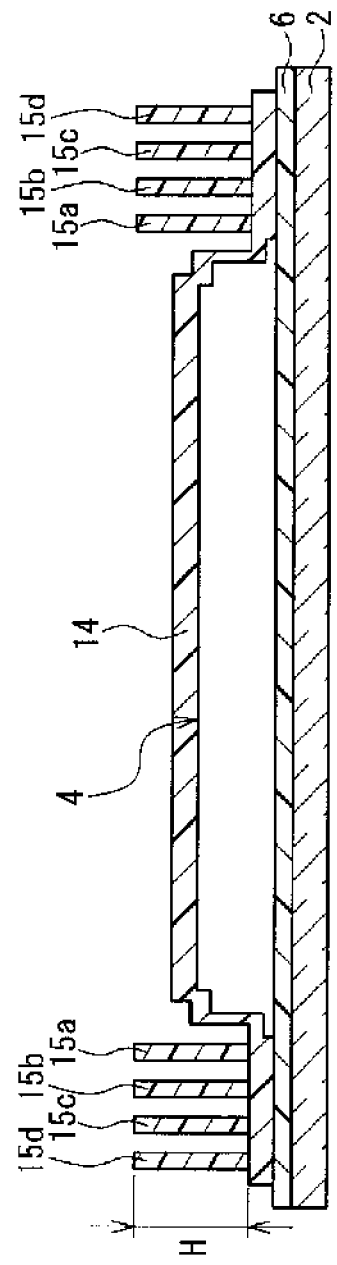
Figure 4A:
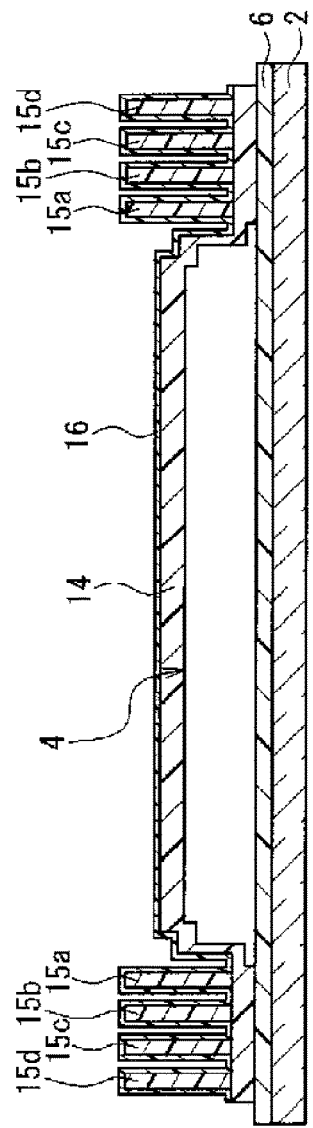
FIGS. 4A and 4B are diagrams for explaining main manufacturing processes for the organic EL display device, and are diagrams illustrating a series of main manufacturing processes subsequently performed after the manufacturing processes illustrated in FIG. 3B.
Figure 4B:
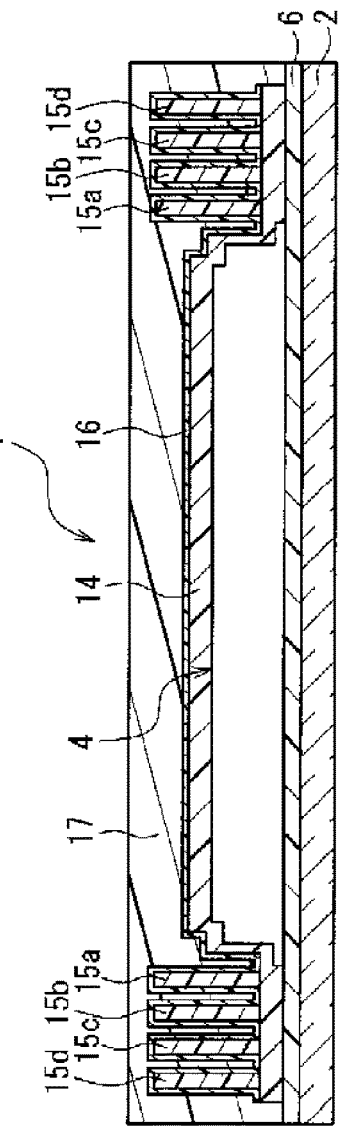

FIGS. 3A and 3B are diagrams for explaining main manufacturing processes for the organic EL display device stated above, and are diagrams illustrating a series of main manufacturing processes. FIGS. 4A and 4B are diagrams for explaining main manufacturing processes for the organic EL display device stated above, and are diagrams illustrating a series of main manufacturing processes subsequently performed after the manufacturing processes illustrated in FIG. 3B.

As illustrated in FIG. 3A, in the case of the organic EL display device 1 according to the present embodiment, the organic EL element 4 is formed on the TFT substrate 2. Then, the first inorganic film 14 is formed using, for example, a vapor deposition method or a chemical vapor deposition (CVD) method, so as to cover the organic EL element 4. In addition, the specific thickness ("T1" in FIG. 3A) of the organic EL element 4 ranges, for example, from 90 to 200 nm, and the specific thickness ("T2" in FIG. 3A) of the first inorganic film 14 is, for example, 50 nm.

Next, as illustrated in FIG. 3B, four protruding bodies 15a to 15d are formed in a frame shape on the first inorganic film 14 so as to surround the organic EL element 4 using, for example, a vapor deposition method or a CVD method or through application. In addition, the protruding height ("H" in FIG. 3B) of each of the protruding bodies 15a to 15d is, for example, 100 nm. However, because each of the protruding bodies 15a to 15d has a protruding height greater than a thickness of the organic EL element 4 as stated above, each of the protruding bodies 15a to 15d is set to have a protruding height greater than the thickness of the organic EL element 4 in the case where the thickness of the organic EL element 4 falls in a range of from 100 to 200 nm.

Next, as illustrated in FIG. 4A, the second inorganic film 16 is formed using, for example, a vapor deposition method or a CVD method so as to cover the first inorganic film 14 and the protruding bodies 15a to 15d.

Then, as illustrated in FIG. 4B, the leveled film 17 is formed on the second inorganic film 16 using, for example, a vapor deposition method or a CVD method or through application. With these steps, the organic EL display device 1 according to the present embodiment is completed by the processes above.

In the case of the organic EL display device 1 configured as stated above according to the present embodiment, the first inorganic film 14 covers the organic EL element (electroluminescence element) 4. Furthermore, the protruding bodies 15a to 15d are provided on the first inorganic film 14 surrounding the organic EL element 4. In addition, the second inorganic film 16 covers the first inorganic film 14 and the protruding bodies 15a to 15d. Moreover, the leveled film 17 is provided on the second inorganic film 16. Thus, unlike the conventional example stated above, in the present embodiment the organic EL display device (electroluminescence device) 1 can be configured that exhibits excellent barrier property and can be produced in a simple manner at a reduced cost. More specifically, unlike the conventional example, the present embodiment can enhance the barrier property for the organic EL element 4 without using laser, and hence, can prevent the manufacturing processes from being complicated while preventing a reduction in manufacturing yields, thereby preventing an increase in cost.

Furthermore, in the case of the present embodiment, the plurality of protruding bodies 15a to 15d are provided on the first inorganic film 14 sequentially surrounding the organic EL element 4. This enables the movement distance of water from the outside to the organic EL element 4 to increase as compared with a case where a single protruding body is provided, and hence, this configuration easily improves an effect of preventing deterioration of the organic EL element 4.

In addition, with the present embodiment, because each of the protruding bodies 15a to 15d has a protruding height greater than a thickness of the first inorganic film 14, this configuration can easily prevent moisture from permeating the organic EL element 4 from the outside.

In addition, with the present embodiment, because each of the protruding bodies 15a to 15d has a protruding height greater than that of thickness of the organic EL element 4, this configuration can easily prevent moisture from permeating the organic EL element 4 from the outside.

In addition, with the present embodiment, the protruding bodies 15a to 15d has a density greater than a density of the leveled film 17. This means that an organic film exhibiting more excellent barrier property than that of the leveled film 17 is used for the protruding bodies 15a to 15d, and hence, the organic EL display device 1 can be easily configured that exhibits excellent barrier property.

Second Embodiment

Figure 5:
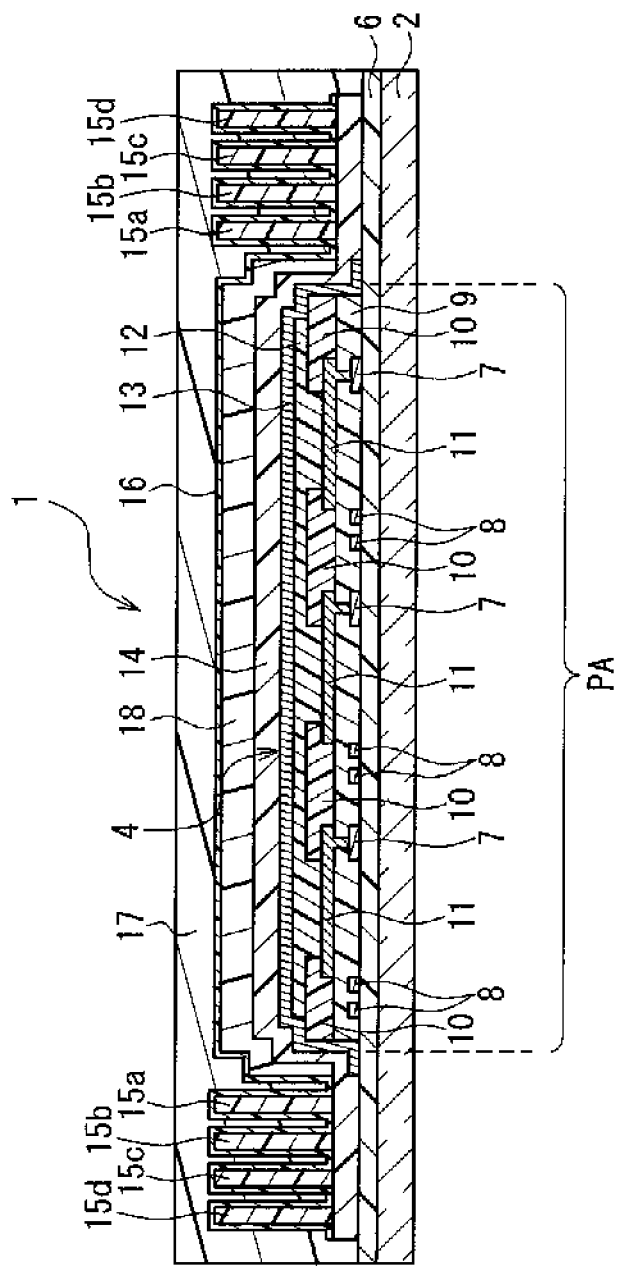
FIG. 5 is a cross sectional view illustrating a cross section of an organic EL display device according to a second embodiment of the present invention.

FIG. 5 is a cross sectional view illustrating a cross section of an organic EL display device according to a second embodiment of the present invention.

In the drawing, a main difference between the present embodiment and the first embodiment stated above is that an organic film layer configured by an organic film is disposed between the first inorganic film and the second inorganic film. Note that elements common to those in the first embodiment are denoted by the same reference signs, and detailed description thereof will be omitted.

As illustrated in FIG. 5, in the case of the organic EL display device 1 according to the present embodiment, the organic film layer 18 is provided between the first inorganic film 14 and the second inorganic film 16. The same organic film as that for, for example, the leveled film 17 is used in the organic film layer 18. In other words, an organic film made, for example, of acrylate, polyurea, parylene, polyimide, or polyamide is used in the organic film layer 18.

Furthermore, the organic film layer 18 has a thickness greater than a thickness of the first inorganic film 14, and thickness of the organic film layer 18 is, for example, 60 nm or greater. In addition, in the present embodiment, the protruding height of each of the protruding bodies 15a to 15d is set to a value greater than the total value of the thickness of the organic film layer 18 and the thickness of the first inorganic film 14.

In addition, this organic film layer 18 has a density less than that of each of the protruding bodies 15a to 15d. More specifically, an organic film having a density greater than that of the organic film layer 18 is used in the protruding bodies 15a to 15d to achieve an improvement in the barrier property for the organic EL element 4. In addition, because the organic film layer 18 is disposed on the pixel area PA, a colorless, transparent organic film is used in the organic film layer 18.

Figure 7A:
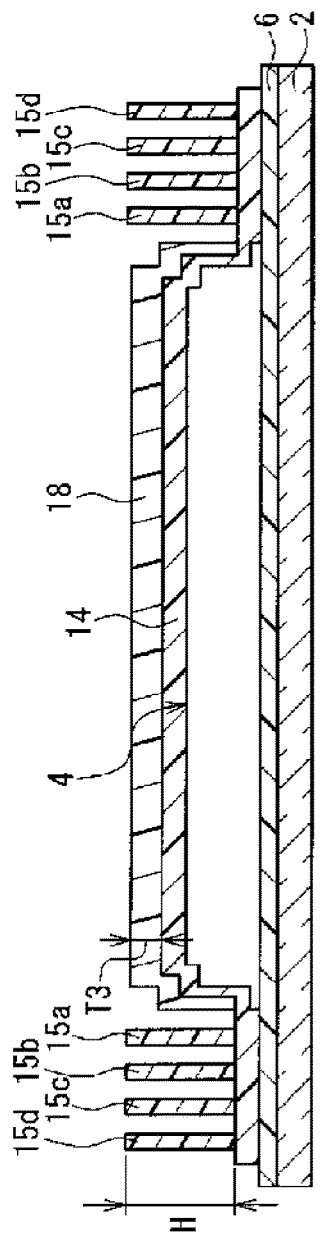
FIGS. 7A and 7B are diagrams for explaining main manufacturing processes for the organic EL display device illustrated in FIG. 5, and are diagrams illustrating a series of main manufacturing processes subsequently performed after the manufacturing processes illustrated in FIG. 6B.
Figure 7B:
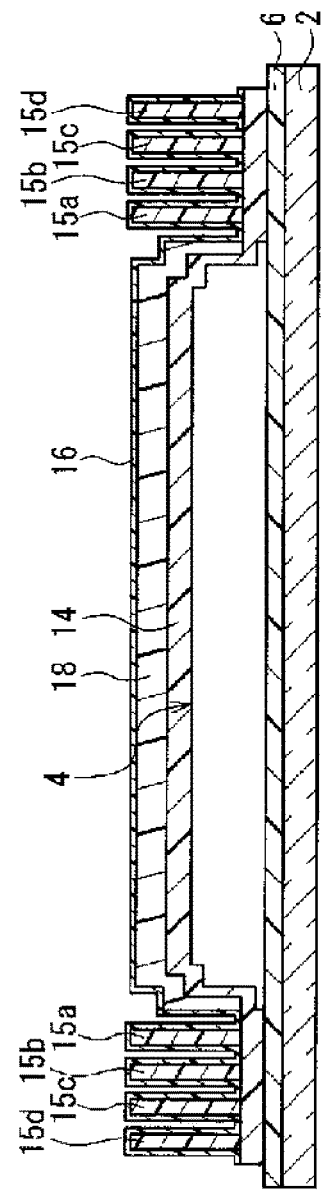
Figure 8:
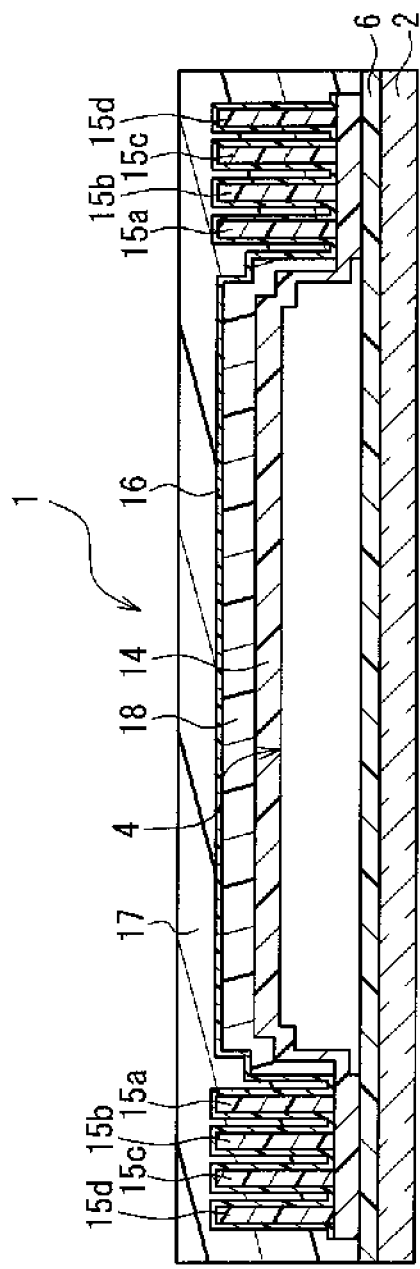
FIG. 8 is a diagram for explaining main manufacturing processes for the organic EL display device illustrated in FIG. 5.

Next, with reference to FIGS. 6 to 8, a method for manufacturing the organic EL display device 1 according to the present embodiment will be specifically stated.

Figure 6A:
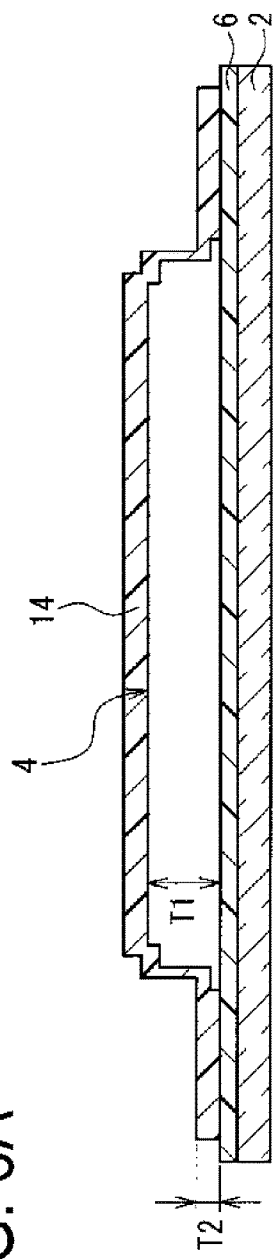
FIGS. 6A and 6B are diagrams for explaining main manufacturing processes for the organic EL display device illustrated in FIG. 5, and are diagrams illustrating a series of main manufacturing processes.
Figure 6B:
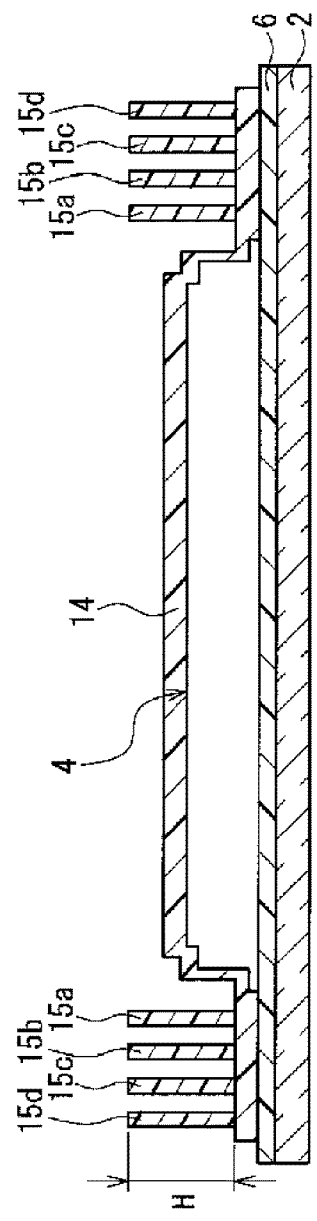

FIGS. 6A and 6B are diagrams for explaining main manufacturing processes for the organic EL display device illustrated in FIG. 5, and are diagrams illustrating a series of main manufacturing processes. FIGS. 7A and 7B are diagrams for explaining main manufacturing processes for the organic EL display device illustrated in FIG. 5, and are diagrams illustrating a series of main manufacturing processes subsequently performed after the manufacturing processes illustrated in FIG. 6B. FIG. 8 is a diagram for explaining main manufacturing processes for the organic EL display device illustrated in FIG. 5, and FIG. 8 is a diagram illustrating a series of main manufacturing processes subsequently performed after the manufacturing processes illustrated in FIG. 7B.

As illustrated in FIG. 6A, in the case of the organic EL display device 1 according to the present embodiment, the organic EL element 4 is formed on the TFT substrate 2. Then, the first inorganic film 14 is formed using, for example, a vapor deposition method or a chemical vapor deposition (CVD) method so as to cover the organic EL element 4. In addition, the specific thickness ("T1" in FIG. 6A) of the organic EL element 4 ranges, for example, from 90 to 200 nm, and the specific thickness ("T2" in FIG. 6A) of the first inorganic film 14 is, for example, 50 nm.

Next, as illustrated in FIG. 6B, four protruding bodies 15a to 15d are formed in a frame shape on the first inorganic film 14 so as to surround the organic EL element 4 using, for example, a vapor deposition method or a CVD method or through application. In addition, the protruding height ("H" in FIG. 6B) of each of the protruding bodies 15a to 15d is, for example, 120 nm. However, because each of the protruding bodies 15a to 15d has a protruding height greater than a thickness of the organic EL element 4 as stated above, each of the protruding bodies 15a to 15d is set to have a protruding height greater than a thickness of the organic EL element 4 in the case where the thickness of the organic EL element 4 falls in a range of from 130 to 200 nm.

Then, as illustrated in FIG. 7A, the organic film layer 18 is formed on the first inorganic film 14 between the first inorganic film 14 and the second inorganic film 16, which is to be formed later, using, for example, a vapor deposition method or a CVD method or through application. In addition, the specific thickness ("T3" in FIG. 7A) of the organic film layer 18 is, for example, 60 nm.

Note that the step of forming the protruding bodies 15a to 15d illustrated in FIG. 6B and the step of forming the organic film layer 18 illustrated in FIG. 7A may be performed in a reverse order. In other words, the organic film layer 18 may be first formed, and then, the protruding bodies 15a to 15d may be formed.

Next, as illustrated in FIG. 7B, the second inorganic film 16 is formed using, for example, a vapor deposition method or a CVD method so as to cover the first inorganic film 14, the protruding bodies 15a to 15d, and the organic film layer 18.

Then, as illustrated in FIG. 8, the leveled film 17 is formed on the second inorganic film 16 using, for example, a vapor deposition method or a CVD method or through application. With these steps, the organic EL display device 1 according to the present embodiment is completed by the processes above.

With the configuration stated above, the present embodiment can achieve operation and effect similar to those of the first embodiment.

In addition, in the case of the present embodiment, because the organic film layer 18 configured by the organic film is disposed between the first inorganic film 14 and the second inorganic film 16, the organic film layer 18 covers the first inorganic film 14. Thus, in the case where a void occurs in the first inorganic film 14, the void can be filled with the organic film layer 18, securing the barrier property.

In addition, in the case of the present embodiment, because a thickness of the organic film layer 18 is greater than a thickness of the first inorganic film 14, this configuration can reliably obtain the barrier property.

In addition, with the present embodiment, because each of the protruding bodies 15a to 15d has a protruding height greater than the total value of the thickness of the first inorganic film 14 and the thickness of the organic film layer 18, this configuration can easily prevent moisture from permeating the organic EL element 4 from the outside.

In addition, with the present embodiment, the value of density of the protruding bodies 15a to 15d is greater than that of density of the organic film layer 18. This means that an organic film exhibiting more excellent barrier property than that of the organic film layer 18 is used for the protruding bodies 15a to 15d, and hence, the organic EL display device 1 can be easily configured that exhibits excellent barrier property.

In addition, in the case of the present embodiment, the same organic film is used for the organic film layer 18 and the leveled film 17, and hence, the organic EL display device 1 can be easily configured that can be produced in a simple manner.

Third Embodiment

Figure 9:
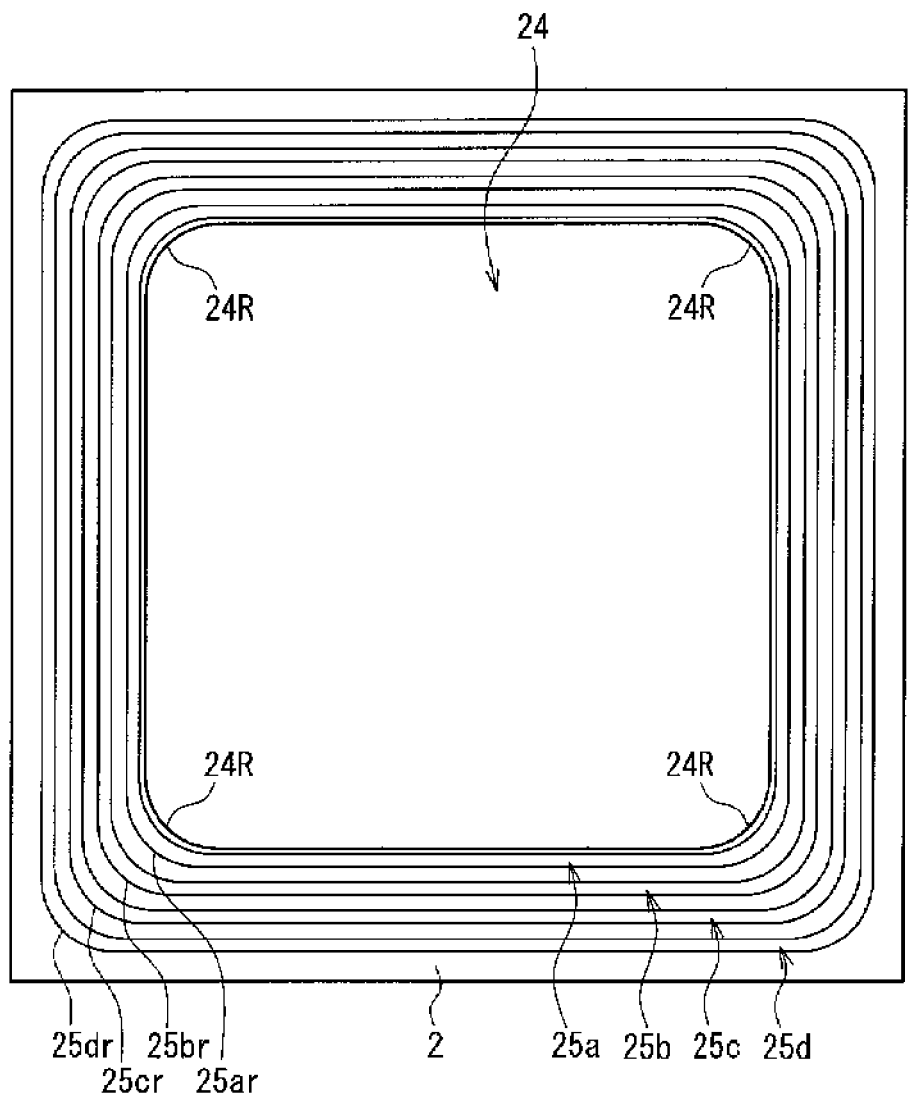
FIG. 9 is a plan view illustrating a configuration of main portions of an organic EL display device according to a third embodiment of the present invention.

FIG. 9 is a plan view illustrating a configuration of main portions of an organic EL display device according to a third embodiment of the present invention.

In the drawing, a main difference between the present embodiment and the first embodiment is that the organic EL element and each of the plurality of protruding bodies include an arc portion formed into an arc shape at each of four corners thereof. Note that elements common to those in the first embodiment are denoted by the same reference signs, and detailed description thereof will be omitted.

In other words, as illustrated in FIG. 9, in the case of the organic EL display device 1 according to the present embodiment, an organic EL element 24 includes arc portions 24R formed into an arc shape at the respective four corners thereof. In addition, a plurality of, for example, four protruding bodies 25a, 25b, 25c, and 25d are provided surrounding the organic EL element 24. These protruding bodies 25a to 25d include arc portions 25ar, 25br, 25cr, and 25dr, respectively, formed into an arc shape at each of four corners thereof and corresponding to the arc portions 24R. In addition, the protruding bodies 25a to 25d are configured similarly to the protruding bodies 15a to 15d according to the first embodiment except that the protruding bodies 25a to 25d include the arc portions 25ar to 25dr formed thereon.

With the configuration stated above, the present embodiment can achieve operation and effect similar to those of the first embodiment.

Furthermore, in the present embodiment, because the organic EL element 24 and the plurality of protruding bodies 25a to 25d include the arc portion 24R and 25ar to 25dr, respectively, formed in an arc shape at each of four corners, the organic EL display device 1 can be easily configured that includes the organic EL element 24 including the arc portions 24R formed at four corners and has excellent barrier property. More specifically, by forming the arc portions on the protruding bodies that seal the organic EL element 24, the arc portions each have a curvature, which makes the organic EL element 24 more likely to receive an effect (for example, permeation of moisture) from the outside. However, in the case of the present embodiment, because the plurality of protruding bodies are provided, this configuration can prevent moisture and the like from permeating even if the arc portions are formed on the protruding bodies, improving the barrier property.

Note that, in the description above, description has been made of a case where the organic EL element 24 and the plurality of protruding bodies 25a to 25d include the arc portions 24R and 25ar to 25dr formed into an arc shape at the four corners. However, the present embodiment is not limited to this. It is sufficient that the arc portion is formed on at least one corner of each of the organic EL element and the plurality of protruding bodies.

Fourth Embodiment

Figure 10:
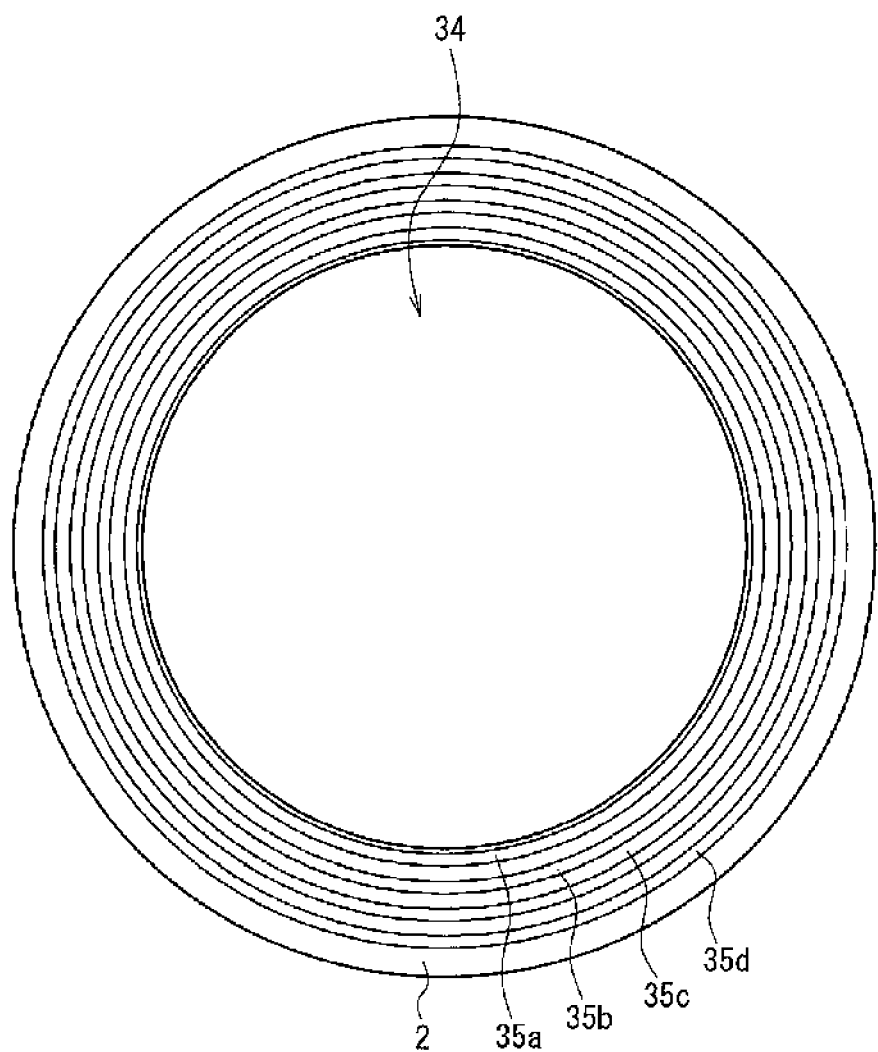
FIG. 10 is a plan view illustrating a configuration of main portions of an organic EL display device according to a fourth embodiment of the present invention.

FIG. 10 is a plan view illustrating a configuration of main portions of an organic EL display device according to a fourth embodiment of the present invention.

In the drawing, a main difference between the present embodiment and the first embodiment is that the organic EL element and the protruding bodies are formed into a round shape. Note that elements common to those in the first embodiment are denoted by the same reference signs, and detailed description thereof will be omitted.

More specifically, as illustrated in FIG. 10, in the case of the organic EL display device 1 according to the present embodiment, an organic EL element 34 formed into a round shape is used. In other words, in the case of this organic EL display device 1, the pixel area PA is formed into a round shape.

Furthermore, in the case of the organic EL display device 1 according to the present embodiment, a plurality of, for example, four protruding bodies 35a, 35b, 35c, and 35d are provided surrounding the organic EL element 34. These protruding bodies 35a to 35d are formed into a round shape corresponding to the organic EL element 34. In addition, the protruding bodies 35a to 35d are configured similarly to the protruding bodies 15a to 15d according to the first embodiment except that the protruding bodies 35a to 35d are formed into a round shape.

With the configuration stated above, the present embodiment can achieve operation and effect similar to those of the first embodiment.

Furthermore, in the case of the present embodiment, the organic EL display device 1 including a round-shaped organic EL element 34 and having excellent barrier property can be easily configured.

Fifth Embodiment

Figure 11:
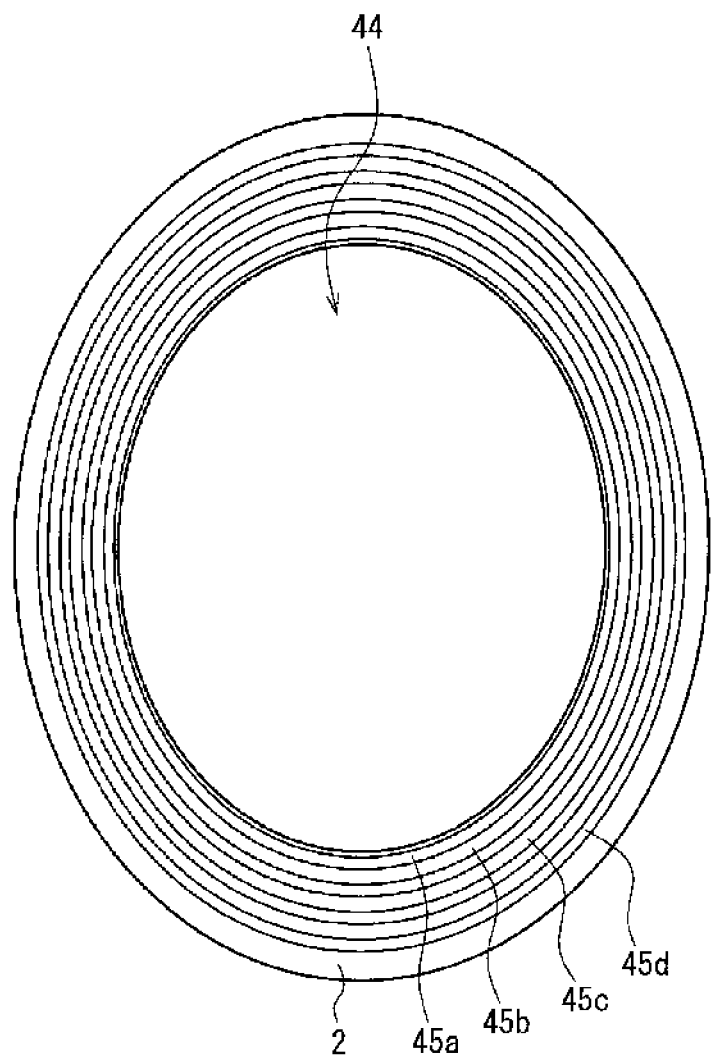
FIG. 11 is a plan view illustrating a configuration of main portions of an organic EL display device according to a fifth embodiment of the present invention.

FIG. 11 is a plan view illustrating a configuration of main portions of an organic EL display device according to a fifth embodiment of the present invention.

In the drawing, a main difference between the present embodiment and the first embodiment is that the organic EL element and the protruding bodies are formed into an oval shape. Note that elements common to those in the first embodiment are denoted by the same reference signs, and detailed description thereof will be omitted.

More specifically, as illustrated in FIG. 11, in the case of the organic EL display device 1 according to the present embodiment, an organic EL element 44 formed into an oval shape is used. In other words, in the case of this organic EL display device 1, the pixel area PA is formed into an oval shape.

Furthermore, in the case of the organic EL display device 1 according to the present embodiment, a plurality of, for example, four protruding bodies 45a, 45b, 45c, and 45d are provided surrounding the organic EL element 44. These protruding bodies 45a to 45d are formed into an oval shape corresponding to the organic EL element 44. In addition, the protruding bodies 45a to 45d are configured similarly to the protruding bodies 15a to 15d according to the first embodiment except that the protruding bodies 45a to 45d are formed into an oval shape.

With the configuration stated above, the present embodiment can achieve operation and effect similar to those of the first embodiment.

Furthermore, in the case of the present embodiment, the organic EL display device 1 including an oval-shaped organic EL element 44 and having excellent barrier property can be easily configured.

Note that all the embodiments stated above are given only as examples, and are not given for limitation. The technical scope of the present invention is defined by Claims, and all modifications made within the scope equivalent to the configuration stated in Claims are included in the technical scope of the present invention.

For example, in the description above, description has been made of a case where an organic EL element is used as an electroluminescence element. However, the present invention is not limited to this. For example, it may be possible to use an inorganic EL element including an inorganic compound.

In addition, in the description above, description has been made of a case where application is made to an active-matrix type organic EL display device including the thin film transistor (TFT) 7. However, the present invention is not limited to this. The present invention may be applied to a passive-matrix type organic EL display device not having any thin film transistor provided therein.

In addition, in the description above, description has been made of a case where application is made to an organic EL display device. However, the present invention is not limited to this. For example, the present invention may be applied to an illumination device such as a back-light device.

Moreover, in addition to those stated above, the first to fifth embodiments may be combined as appropriate.

INDUSTRIAL APPLICABILITY

The present invention is useful for an electroluminescence device that exhibits excellent barrier property and can be produced in a simple manner at a reduced cost.

REFERENCE SIGNS LIST

1 Organic EL display device (electroluminescence device)
2 TFT substrate (substrate)
4, 24, 34, 44 Organic EL element (electroluminescence element)
24R Arc portion
14 First inorganic film
15a to 15d, 25a to 25d, 35a to 35d, 45a to 45d Protruding body
25ar to 25dr Arc portion
16 Second inorganic film
17 Leveled film
18 Organic film layer

The invention claimed is:

1. An electroluminescence device comprising:
a substrate;
an electroluminescence element provided on the substrate;
a first inorganic film covering the electroluminescence element;
at least one protruding body having a frame shape, the at least one protruding body configured by an organic film and surrounding the electroluminescence element on the first inorganic film;
a second inorganic film covering the first inorganic film and the at least one protruding body; and
a leveled film configured by an organic film and provided on the second inorganic film,
wherein an organic film layer configured by an organic film is disposed between the first inorganic film and the second inorganic film and covers the electroluminescence element,
the at least one protruding body surrounds the organic film,
a slit is formed between the organic film and the at least one protruding body,
a first inorganic film is exposed in the slit,
the second inorganic film contacts the first inorganic film in the slit,
the leveled film fills the slit, and
the at least one protruding body each has a protruding height greater than a total value of a thickness of the first inorganic film and a thickness of the organic film layer.

2. The electroluminescence device according to claim 1, wherein the organic film layer has a thickness greater than a thickness of the first inorganic film.

3. The electroluminescence device according to claim 1, wherein the at least one protruding body has a density greater than a density of the organic film layer.

4. The electroluminescence device according to claim 1, wherein an organic film used for the organic film layer is identical to an organic film used for the leveled film.

5. The electroluminescence device according to claim 1, wherein the at least one protruding body comprises a plurality of protruding bodies, and
the plurality of protruding bodies are disposed on the first inorganic film and sequentially surround the electroluminescence element.

6. The electroluminescence device according to claim 5, wherein the electroluminescence element and the plurality of protruding bodies each include at least one corner including an arc portion formed into an arc shape.

7. The electroluminescence device according to claim 1, wherein the electroluminescence element and the at least one protruding body are formed into a round shape.

8. The electroluminescence device according to claim 1, wherein the electroluminescence element and the at least one protruding body are formed into an oval shape.

9. The electroluminescence device according to claim 1, wherein the at least one protruding body each has a protruding height greater than a thickness of the first inorganic film.

10. The electroluminescence device according to claim 1, wherein the at least one protruding body each has a protruding height greater than a thickness of the electroluminescence element.

11. The electroluminescence device according to claim 1, wherein the at least one protruding body each has a density greater than a density of the leveled film.

12. The electroluminescence device according to claim 1, wherein a material having flexibility is used in the substrate.

13. The electroluminescence device according to claim 1, wherein a foundation film is provided between the substrate and the electroluminescence element, and
the leveled film contacts the foundation film around a periphery of the electroluminescence device.

14. The electroluminescence device according to claim 1, wherein the at least one protruding body each has a protruding height smaller than a thickness of the leveled film around a periphery of the electroluminescence device.

15. The electroluminescence device according to claim 5, wherein another slit is formed between the plurality of protruding bodies,
a first inorganic film is exposed in the another slit,
the second inorganic film contacts the first inorganic film in the another slit, and
the leveled film fills the another slit.

16. An electroluminescence device comprising:
a substrate;
an electroluminescence element provided on the substrate;
a first inorganic film covering the electroluminescence element;
at least one protruding body having a frame shape, the at least one protruding body configured by an organic film and surrounding the electroluminescence element on the first inorganic film;
a second inorganic film covering the first inorganic film and the at least one protruding body; and
a leveled film configured by an organic film and provided on the second inorganic film,
wherein an organic film layer configured by an organic film is disposed between the first inorganic film and the second inorganic film and covers the electroluminescence element,
the at least one protruding body surrounds the organic film,
a slit is formed between the organic film and the at least one protruding body,
a first inorganic film is exposed in the slit,
the second inorganic film contacts the first inorganic film in the slit,
the leveled film fills the slit, and
the at least one protruding body has a density greater than a density of the organic film layer or a density of the leveled film.

17. The electroluminescence device according to claim 16,
wherein an organic film used for the organic film layer is identical to an organic film used for the leveled film.

18. The electroluminescence device according to claim 16,
wherein the at least one protruding body comprises a plurality of protruding bodies, and
the plurality of protruding bodies are disposed on the first inorganic film and sequentially surround the electroluminescence element.

19. An electroluminescence device comprising:
a substrate;
an electroluminescence element provided on the substrate;
a first inorganic film covering the electroluminescence element;
at least one protruding body having a frame shape, the at least one protruding body configured by an organic film and surrounding the electroluminescence element on the first inorganic film;
a second inorganic film covering the first inorganic film and the at least one protruding body; and
a leveled film configured by an organic film and provided on the second inorganic film,
wherein an organic film layer configured by an organic film is disposed between the first inorganic film and the second inorganic film and covers the electroluminescence element,
the at least one protruding body surrounds the organic film,
a slit is formed between the organic film and the at least one protruding body,
a first inorganic film is exposed in the slit,
the second inorganic film contacts the first inorganic film in the slit,
the leveled film fills the slit, and
an organic film used for the organic film layer is identical to an organic film used for the leveled film.

20. The electroluminescence device according to claim 19,
wherein the at least one protruding body comprises a plurality of protruding bodies, and
the plurality of protruding bodies are disposed on the first inorganic film and sequentially surround the electroluminescence element.

* * * * *